United States Patent [19]

Maschek et al.

[11] Patent Number: 4,656,554
[45] Date of Patent: Apr. 7, 1987

[54] SHUNT ARRANGEMENT WITH POWER OVERLOAD PROTECTION BY A VOLTAGE RESPONSIVE BIDIRECTIONAL SWITCH

[75] Inventors: Martin Maschek, Würenlos; Georg Mastner, Niederrohrdorf, both of Switzerland

[73] Assignee: BBC Brown, Boveri & Company, Limited, Baden, Switzerland

[21] Appl. No.: 713,495

[22] Filed: Mar. 19, 1985

[30] Foreign Application Priority Data

Mar. 21, 1984 [CH] Switzerland ............... 1421/84

[51] Int. Cl.$^4$ ............................................. H02H 9/04
[52] U.S. Cl. ..................................... 361/56; 361/91; 343/DIG. 1
[58] Field of Search ............... 361/54, 56, 91; 342/DIG. 1; 323/367, 909

[56] References Cited

U.S. PATENT DOCUMENTS

| | | | |
|---|---|---|---|
| 2,882,494 | 4/1959 | Webster | 324/DIG. 1 X |
| 3,638,114 | 1/1972 | Finley | 324/115 |
| 4,123,934 | 11/1978 | Höht | 324/DIG. 1 X |
| 4,158,150 | 6/1979 | Dever | 361/91 X |
| 4,322,767 | 3/1982 | El Hamamsy et al. | 361/56 |
| 4,400,755 | 8/1983 | Lezan | 361/91 |
| 4,424,544 | 1/1984 | Chang et al. | 361/56 |
| 4,475,139 | 10/1984 | Chadwick | 361/56 X |
| 4,536,816 | 9/1985 | Matsumura et al. | 361/56 X |

FOREIGN PATENT DOCUMENTS 2034741 12/1970 France .

OTHER PUBLICATIONS

"Logic-Supply Crowbar", L. Strahan, Electrical Design New, Bank 16, #22, 15, Nov. 1971.

Primary Examiner—A. D. Pellinen
Assistant Examiner—A. Jonathan Wysocki
Attorney, Agent, or Firm—Burns, Doane, Swecker & Mathis

[57] ABSTRACT

A shunt arrangement for processing the output current of an inductive current transformer having a wide dynamic range in which, in order to provide high-precision conversion with smaller currents, a power shunt is connected in series with a precision shunt which is connected in parallel with an overvoltage protection circuit containing a switchable semiconductor rectifier and a control circuit. The rectifier changes to a conductive state if the voltage at the precision shunt reaches a limit value. The control circuit contains a symmetric voltage limiting element which is constructed as a pair of limiting diodes or as a fullwave rectifier, the output of which is connected to a reference diode. In order to check the switching state of the overvoltage protection circuit, the series circuit including the power shunt and the precision shunt is connected in parallel with a series circuit consisting of a first bridge resistor and a second bridge resistor which, together with the shunts, form a balanced bridge circuit whereby, when the overvoltage protection circuit is inhibited, bridge circuit is monitored by a window discriminator.

15 Claims, 3 Drawing Figures

SHUNT ARRANGEMENT WITH POWER OVERLOAD PROTECTION BY A VOLTAGE RESPONSIVE BIDIRECTIONAL SWITCH

BACKGROUND OF THE INVENTION

The invention relates to a shunt arrangement and, in particular to a shunt arrangement to be used for converting electric currents varying over a large range into proportional output signals and particularly for processing output currents from inductive current transformers with an air-gap core used for protective purposes.

Due to the power rating required because of the wide dynamic range involved, such shunt arrangements are not suitable for high-precision conversion.

OBJECT AND SUMMARY OF THE INVENTION

The invention has as an object the creation of a shunt arrangement which, in addition to conversion, satisfying lesser requirements for precision, of electric currents fluctuating over a wide range into a proportional output signal, the capability of high-precision conversion of currents varying within a predetermined part range.

This object is achieved by the use of a series connected precision shunt and an overload protection circuit connected in parallel with the precision shunt.

The advantages of the invention can be seen particularly in the fact that the current supplied by a single source can be converted without elaborate intermediate conversion, the reactions of which are frequently difficult to calculate, for example, by transformers—both with a wide dynamic range with lower precision and with greater precision with a smaller dynamic range.

In the case where output currents from inductive current transformers are processed, the shunt arrangement according to the invention makes it possible, in particular, to save a second air-gap-less transformer, as usually used for measuring purposes, which, for protection of the sensitive high-precision shunt, becomes saturated at higher currents.

In the following description, the invention is explained in greater detail with the aid of drawings which represent only one approach.

DETAILED DESCRIPTION

Figure 1:
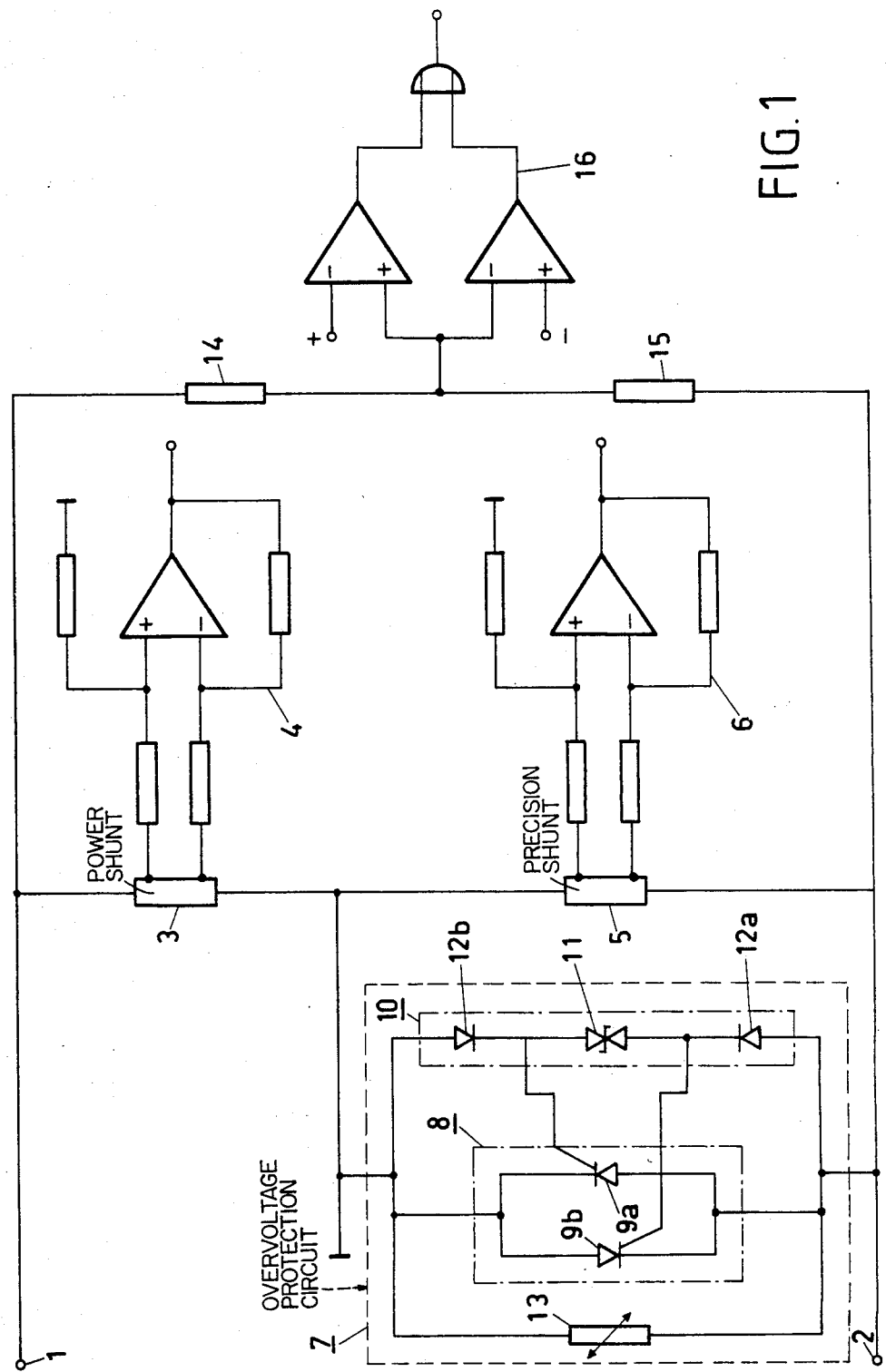
FIG. 1 shows a shunt arrangement according to the invention, according to a first embodiment.

In its basic configuration, the shunt arrangement of FIG. 1 contains, between a first connection 1 and a second connection 2, a power shunt 3 of a type which is commercially available. The power shunt 3 is followed in a known manner by a first amplifier circuit 4 which is connected by means of Kelvin terminals.

According to the invention, the power shunt 3 is connected in series with a precision shunt 5 which can be implemented as a high-precision film resistor as sold, for example, by VISHAY Co. and which is followed in a known manner by a second amplifier circuit 6 which is also connected by means of Kelvin terminals. In parallel with this precision shunt an overvoltage protection circuit 7 is connected which is inhibited for as long as the voltage dropped across the precision shunt 5 remains within a predetermined operating range and which shorts out the precision shunt 5 as soon as the said voltage reaches one of two limit values $U_g$, $-U_g$ which are located symmetrically to the voltage zero and which limit the operating range.

The overvoltage protection circuit 7 contains a semiconductor switch 8, consisting of two antiparallel-connected thyristors 9a, 9b, and is connected between the connections of the overvoltage protection circuit. The semiconductor switch 8 is triggered by a gate trigger circuit 10 which is connected in parallel with the switch and which contains a symmetric voltage limiting element; in this case a pair 11 of zener diodes. On each side of this pair, a triggering connection for triggering one of the thyristors 9a, 9b branches off. The pair 11 of zener diodes is adjoined by two diodes 12a, 12b the anodes of which are connected to the connections of the overvoltage limiting circuit 7.

In parallel with the semiconductor switch 8 and with the gate trigger circuit 10, a fast-response overvoltage limiter is connected which, with fast transients, takes over the overvoltage protection function until the thyristors 9a, 9b fire. It is implemented as varistor 13 but, for example, a bidirectional Transzorb® (registered trade mark of General Semiconductor, USA) diode could also be used.

In parallel with the series circuit of power shunt 3 and precision shunt 5 a series circuit of a first bridge resistor 14 and a second bridge resistor 15 is located which, together with the power shunt 3 and the precision shunt 5, forms a balanced bridge circuit. In order to prevent the measuring accuracy at the shunts from being impaired, the bridge resistors 14, 15 have been selected to have a much higher resistance than the shunts. The balanced point of the bridge circuit, located between the first bridge resistor 14 and the second bridge resistor 15, is connected to the input of a window discriminator 16 which at this point monitors the voltage and detects whether it is within a tolerance range extending symmetrically around the voltage zero. The operation of the shunt arrangement according to the first embodiment of the invention will now be explained in connection with FIG. 3.

Figure 3:
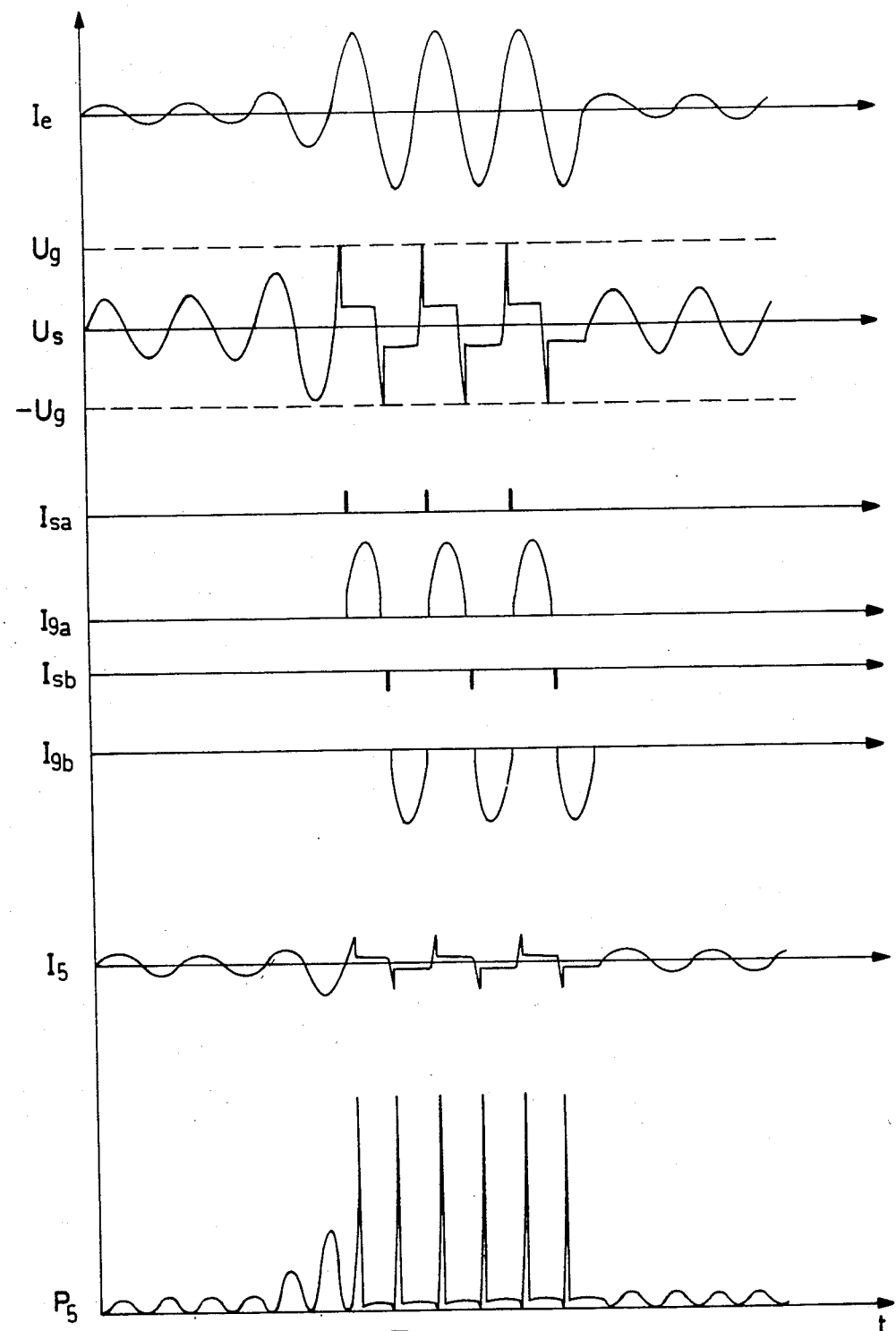
FIG. 3 shows the variations with time of various electric quantities occurring in shunt arrangements according to the invention according to the first or second embodiment.

FIG. 3 shows an illustrative variation with time of the input current $I_e$ flowing from the second connection 2 to ground—an equally large current of the opposite sign flows from the first connection 1 via the power shunt 3 to ground—which produces at the precision shunt 5 a voltage $U_5$ which initially does not reach the limit values $U_g$, $-U_g$ so that the overvoltage protection circuit 7 is inhibited and the voltage $U_5$ at the precision shunt 5 is very exactly proportional to the input current $I_e$. The bridge circuit formed by the power shunt 3, the precision shunt 5, the first bridge resistor 14 and the second bridge resistor 15 is balanced and the output signal of the window comparator is "0". With an overcurrent surge, the voltage $U_5$ at the precision shunt 5 becomes large enough for the limit value $U_g$ to be reached.

This causes the symmetrical voltage limiting element 11 to respond so that the gate of the thyristor 9a is supplied from connection 2 via diode 12a with a trigger current $I_{sa}$ and it fires. Approximately until the next current zero transition, the thyristor 9a now carries the largest proportion of the input current $I_e$ with the thyristor current $I_{9a}$. The voltage $U_5$ at the precision shunt 5 largely drops. The current $I_5$ through the precision shunt 5 is then also correspondingly low. In a completely analogous manner, the thyristor 9b is fired with the next half wave and so on until the amplitude of the input current $I_e$ has again dropped far enough so that the limit values $U_g$, $-U_g$ are no longer reached by the voltage $U_5$ dropped across the precision shunt 5.

Naturally, it is possible to use only a passive overvoltage limiter, for example a varistor, as overvoltage protection circuit. In this arrangement, however, the operating range must be selected to be smaller than the range delimited by the limit values $U_g$, $-U_g$, because of the unsharp transition between the blocking state and the conducting state. In addition, the use of a semiconductor rectifier which changes to a conducting state when one of the loading limits is reached and remains in this state approximately until the next zero transition of the current, has the advantage that the power consumption $P_5$ of the precision shunt 5 is also very low, especially with large overcurrents. The shorting of the precision shunt 5 also reduces the resistance between the first connection 1 and the second connection 2. If the shunt arrangement according to the invention is used for processing the output current of an inductive current transformer this means a reduction of the load at high currents, the consequence of which is that the saturation of the primary transformer occurs only at higher currents than would be the case, for example, with an overvoltage protection circuit which holds the voltage in each case at the limit value $U_g$ or $-U_g$ for a part of the duration of the respective half wave as would be the case, for example, with a varistor.

The semiconductor switch 8, especially the antiparallel-connected pair of thyristors 9a, 9b, which can be switched by a gate trigger circuit 10 was selected because of the great precision and the high current carrying capacity which can be achieved with such an arrangement.

If the precision shunt 5 is shorted, the potential of the balanced point of the bridge circuit formed by the power shunt 3, the precision shunt 5, the first bridge resistor 14 and the second bridge resistor 15 if the overvoltage protection circuit 7 is inhibited, is outside the tolerance range defined by the window discriminator 16. The output signal of the window comparator 16 is "1". It indicates the occurrence of overcurrents and can be used, for example, for switching measuring ranges.

Figure 2:
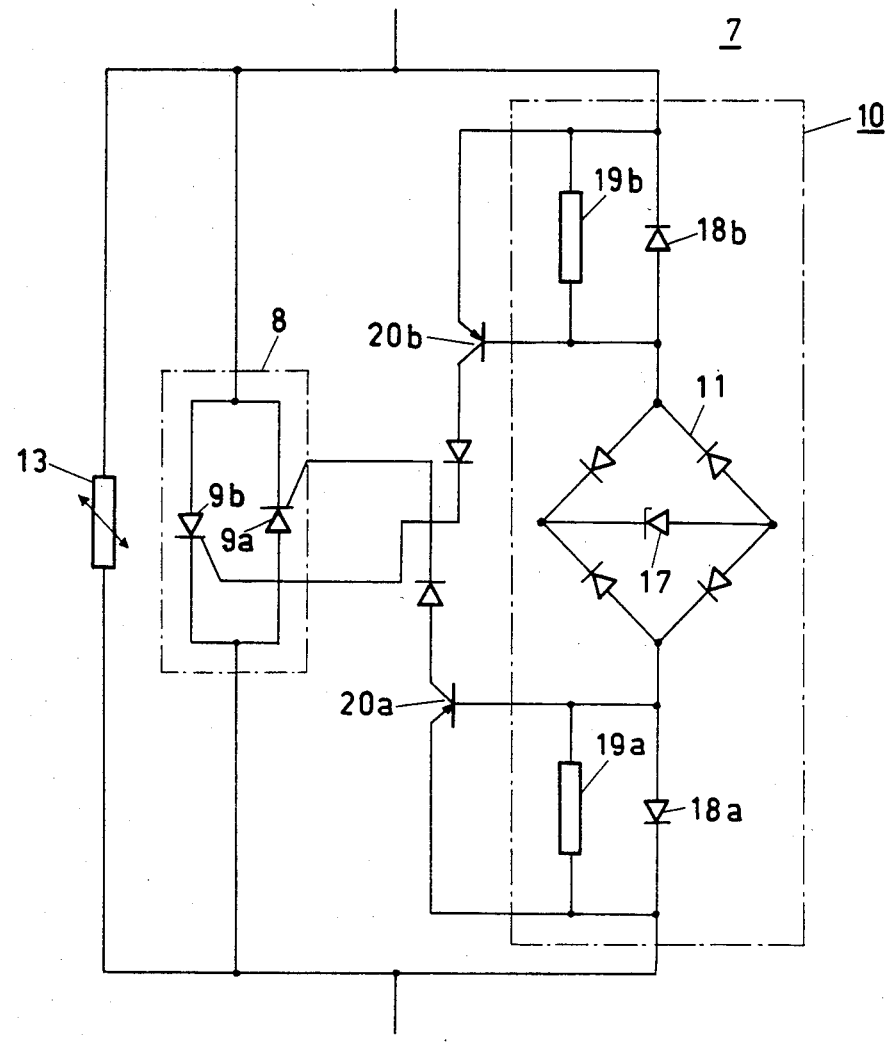
FIG. 2 shows a part of a shunt arrangement according to the invention, according to a second embodiment.

FIG. 2 shows an overvoltage protection circuit according to a second embodiment of a shunt arrangement according to the invention, which circuit differs from the overvoltage protection circuit according to the first embodiment especially by a modified gate trigger circuit 10.

The gate trigger circuit 10 again contains a symmetric voltage limiting element 11. It is implemented by a fullwave rectifier the output of which is connected to a reference diode 17. This results in the absolute values of the two limit values being matched with great accuracy. If the shunt arrangement according to the invention is used for processing the output current of an inductive current transformer, a cumulative magnetization of the primary transformer core is eliminated because of the precise symmetric position of the limit values. Each side of the voltage limiting element 11 is connected in via diodes 18a, b and respective parallel resistors 19a, b, to the connections of the overvoltage protection circuit 7.

In each case one control connection branches off to control a respective PNP transistor 20a, b, which connects one of the connections of the overvoltage protection circuit 7 to the gate of one of the thyristors 9a, 9b.

If now the voltage $U_5$ dropped across the precision shunt 5 reaches the limit value $U_g$, the reference diode 17 changes into its conducting state and the potential at the base of the transistor 20a drops below the potential of the connection of the overvoltage protection circuit 7, which connection is connected to the second electric connection 2 of the shunt arrangement and is at high potential so that the transistor switches on and feeds a trigger current $I_{sa}$ to the gate of the thyristor 9a so that this thyristor fires. With half waves of the opposite polarity, the circuit behaves exactly analogously as the circuit of the first embodiment. At both polarities, the amount of the respective limit value $U_g$ or $-U_g$ is determined by the breakdown voltage of the same reference diode 17 which results in the abovementioned precise symmetry.

We claim:

1. A shunt arrangement, comprising:
   an electric circuit including a power shunt;
   a precision shunt connected in series to said power shunt; and
   a overvoltage protection circuit means connected in parallel to and responsive to a voltage drop across said precision shunt for conducting when said voltage substantially reaches one of an upper limit value and a lower limit value of an operating range containing voltage zero and for being inhibited when said voltage remains within said operating range.

2. A shunt arrangement according to claim 1, wherein the overvoltage protection circuit means includes a bidirectional semiconductor switch which changes to a conducting state when one of the limit values is reached and remains in the conducting state substantially until the next current zero transition.

3. A shunt arrangement according to claim 2, wherein the bidirectional semiconductor switch can be switched and, wherein the overvoltage protection circuit means further includes a gate trigger circuit connected in parallel with the bidirectional semiconductor switch and whereby, if one of the upper and lower limit values is reached, the gate trigger circuit delivers a triggering signal to the bidirectional semiconductor switch which causes the bidirectional semiconductor switch to change to a conducting state.

4. A shunt arrangement according to claim 3, wherein the bidirectional semiconductor switch includes two antiparallel-connected thyristors.

5. A shunt arrangement according to claim 4, wherein the gate trigger circuit includes a symmetric voltage limiting element and a connection for triggering one of the two thyristors is connected on each side of the gate trigger circuit.

6. A shunt arrangement according to claim 5, wherein a gate of one thyristor is connected via a first switch to one connection and a gate of the other thyristor is connected via a second switch to the other connection of the overvoltage protection circuit and wherein said first switch and said second switch can be switched via the gate trigger circuit via in each case one of the triggering connections.

7. A shunt arrangement according to claim 5 wherein the symmetric voltage limiting element includes a pair of limiting diodes.

8. A shunt arrangement according to claim 5 wherein the symmetric voltage limiting element includes a full-wave rectifier having an output connected to a voltage reference element.

9. A shunt arrangement according to claim 1 wherein the series circuit of the power shunt and the precision shunt is connected in parallel with a series circuit consisting of a first resistor and a second resistor having values such that, together with the power shunt and the precision shunt they form a balanced bridge circuit, and wherein a window discriminator is provided having an input connected to a calibrating point of the bridge circuit located between the first resistor and the second resistor.

10. A shunt arrangement comprising:
an electric circuit including a power shunt;
a precision shunt connected in series with said power shunt; and
overvoltage protection circuit means connected in parallel with and responsive to a voltage drop across said precision shunt for conducting when said voltage substantially reaches one of an upper limit value and a lower limit value of an operating range containing voltage zero, and for being inhibited when said voltage remains within said operating range;
said overvoltage protection circuit including a bidirectional semiconductor switch which changes to a conducting state when one of the limit values is reached and remains in the conducting state substantially until the next zero transition;
said bidirectional switch being switchable and said overvoltage protection circuit further including a gate trigger circuit connected in parallel with the bidirectional semiconductor switch and whereby, if one of the upper and lower limit values is reached, the gate trigger circuit delivers a triggering signal to the bidirectional semiconductor switch which causes the bidirectional semiconductor switch to change to a conducting state.

11. A shunt arrangement according to claim 10, wherein the bidirectional semiconductor switch includes two antiparallel-connected thyristors.

12. A shunt arrangement according to claim 11, wherein the gate trigger includes a symmetric voltage limiting element and a connection for triggering one of the two thyristors is connected on each side of the gate trigger circuit.

13. A shunt arrangement according to claim 12, wherein a gate of one thyristor is connected via a first switch to one connection and a gate of the other thyristor is connected by a second switch to the other connection of the overvoltage protection circuit and wherein said first switch and said second switch can be switched via the gate trigger via in each case one of the triggering connections.

14. A shunt arrangement according to claim 12, wherein the symmetric voltage limiting element includes a pair of limiting diodes.

15. A shunt arrangement according to claim 12, wherein the symmetric voltage limiting element includes a full-wave rectifier having an output connected to a voltage reference element.

* * * * *